United States Patent
Mirzaei et al.

(10) Patent No.: US 8,913,968 B2
(45) Date of Patent: Dec. 16, 2014

(54) POWER REDUCTION AND LINEARIZING TECHNIQUES OF TRANSMITTERS

(71) Applicant: Broadcom Corporation, Irvine, CA (US)

(72) Inventors: Ahmad Mirzaei, San Diego, CA (US); Hooman Darabi, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 55 days.

(21) Appl. No.: 13/672,450

(22) Filed: Nov. 8, 2012

(65) Prior Publication Data

US 2014/0128014 A1    May 8, 2014

(51) Int. Cl.
*H04B 1/04* (2006.01)
*H03B 19/00* (2006.01)

(52) U.S. Cl.
CPC . *H04B 1/04* (2013.01); *H03B 19/00* (2013.01)
USPC .................................. 455/114.1; 455/115.1

(58) Field of Classification Search
USPC ............... 455/91, 114.1, 114.2, 114.3, 115.1, 455/127.1, 127.2; 330/149
See application file for complete search history.

(56) References Cited

U.S. PATENT DOCUMENTS

| 8,611,459 B2 * | 12/2013 | McCallister | ............... 455/114.3 |
| 2011/0217940 A1 * | 9/2011 | Oliaei | ......................... 455/127.2 |
| 2012/0139629 A1 * | 6/2012 | Fung | ............................. 330/149 |

* cited by examiner

*Primary Examiner* — Thanh Le
(74) *Attorney, Agent, or Firm* — Brinks Gilson & Lione (57) ABSTRACT

A transmitter includes a power amplifier driver to amplify a communication signal and a mixer connected with the power amplifier driver, the mixer to output the communication signal to the power amplifier driver. A capacitor and an inductor connect with the mixer and the power amplifier driver. The capacitor and the inductor create a resonant frequency to attenuate frequency components around a determined order of a local oscillator signal.

20 Claims, 12 Drawing Sheets

POWER REDUCTION AND LINEARIZING TECHNIQUES OF TRANSMITTERS

TECHNICAL FIELD

This disclosure relates generally to communication systems and methods. More particularly, it relates to low-power, low-area and/or multi-band, multi-mode transmitters.

BACKGROUND

A transmitter or radio transmitter in electronics and telecommunications is an electronic device which with an antenna produces radio waves. The transmitter can generate a radio frequency alternating current, which can be applied to the antenna. When excited by the alternating current the antenna can radiate radio waves. The transmitter can be used in equipment that generates radio waves for communication purposes and radiolocation, such as radar and navigational transmitters. Generators of radio waves for heating or industrial purposes can also include transmitters.

BRIEF DESCRIPTION OF THE DRAWINGS

The system may be better understood with reference to the following drawings and description. In the figures, like reference numerals designate corresponding parts throughout the different views.

DETAILED DESCRIPTION

Driven by cost and marketing, low power consuming radio transmitters are desirable. The description below relates to transmitters that can reduce power consumption and a die area compared to some typical transmitters. The use of passive mixers in the design can be advantageous over active-based counterparts. The passive mixers can provide for lower power consumption than active mixers, improved noise and linearity performance, and reduced time for local oscillator (LO) feed-through (LOFT) and image rejection ratio (IRR) calibration, e.g., at the factory and during device operation.

A power amplifier (PA) driver (PAD) after the mixers can be the most power consuming block in the transmitter. The presence of up-converted frequency components at the passive mixer output, PAD input, around 3LO and 5LO can be a primary factor in requiring more power consumption. The systems and methods can include a resonant circuit to reduce the power needed by the PAD to handle the up-converted frequencies. For example, by notching out the up-converted frequency components around 3LO, the linearity requirements of the PAD driver can be relaxed. About a 6 dB linearity relaxation of PAD can allow for use of a PAD in the class AB region, rather than a more power consuming class-A PAD. Therefore, the systems and methods can also save current consumption at the power consuming PAD block. The systems and methods can be used for multi-band, multi-mode applications.

Figure 1:
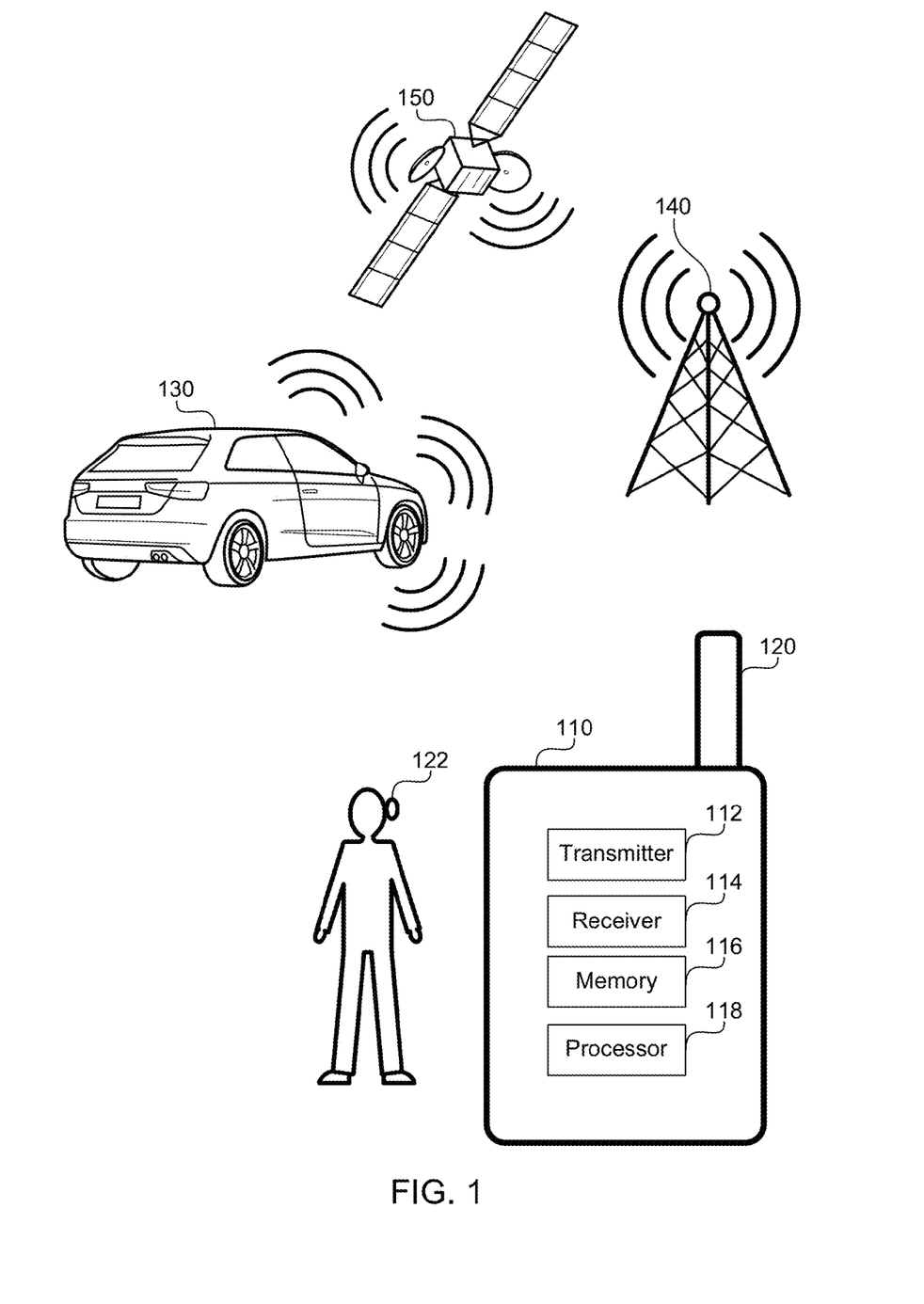
FIG. 1 is a block diagram of an exemplary communication environment.

FIG. 1 is a block diagram of an exemplary communication environment 100. Communication signals can be transmitted and received by endpoints. In one example, the endpoint is a communication device 110, such as a cell phone, wireless network device, personal digital assistant, tablet, portable email device, smartphone or a portable gaming system. The communication device can include a transmitter 112, a receiver 114, a memory 116, a processor 118 and an antenna 120 to wirelessly exchange information, e.g., emails, text messages, radio, music, television, videos, video games, digital information, etc., with other endpoints. The transmitter 112 and receiver 114 can be configured separately or together, such as in a transceiver. The communication device 110 may also wirelessly connect with a radio receiver or other audio device such as earpiece 122.

The communication environment 100 can also include other endpoints such as vehicles 130, such as automobiles, aircraft, ships and spacecraft. The communication environment 100 can also include devices to provide a communication link between the endpoints such as cellular towers 140 and satellites 150. Transmitter 112 can also be component parts of many electronic devices that communicate by radio signals, such as wireless computer networks, Bluetooth enabled devices, garage door openers, radar sets, and navigational beacons. The antenna 120 may be enclosed inside a case or attached to the outside of the transmitter 112, as in portable devices such as cell phones, walkie-talkies, and auto keyless remotes.

Figure 2:
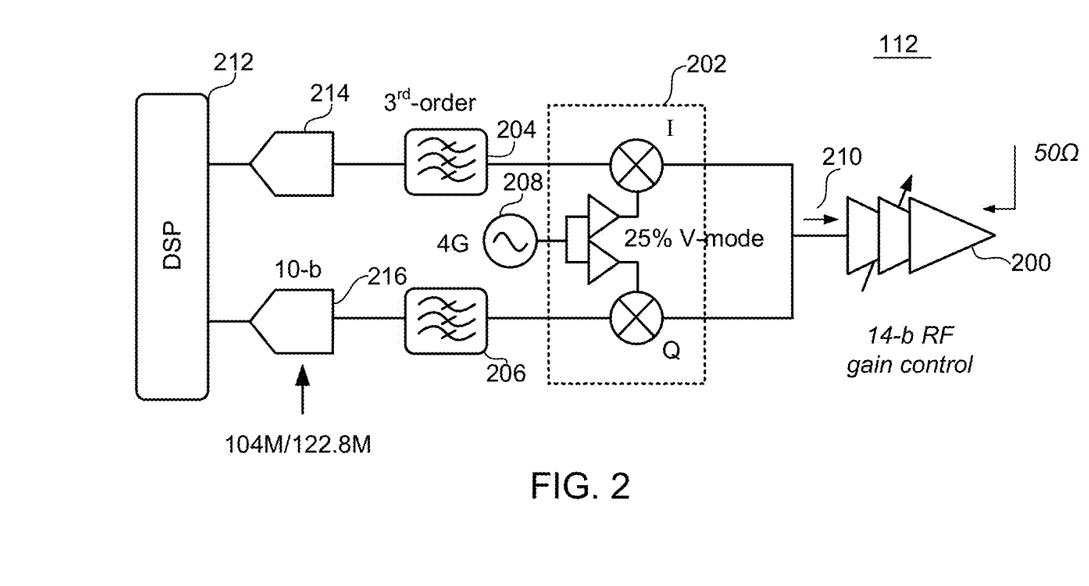
FIG. 2 is a circuit diagram of an exemplary transmitter.

FIG. 2 is a circuit diagram of an exemplary transmitter 112, e.g., implemented with an integrated circuit. The transmitter 112 can operate at about 1.5 V, or less, and match about a 50 ohm impedance with no external components. Gain control can be accomplished with a PA driver 200 for the low and high bands of the wideband code division multiple-access (WCDMA) and enhanced data global system for mobile (GSM) environment (EDGE)/GSM modes. The PA driver 200 may provide for about 14-bit gain control. The PA driver 200 also connects with an IQ mixer 202. The IQ channels can be converted for WCDMA and EDGE, and direct phase-locked loop (PLL) modulation can be used for Gaussian minimum-shift keying (GMSK). The IQ mixer 202 receives filtered analog signals from low pass filters 204 and 206, and a local oscillator (LO) signal from voltage-controlled oscillator 208. The IQ mixer 202 outputs modulated analog signals 210. The modulated analog signals 210 can begin as digital signals from a digital signal processor 212, including audio, video and/or data signals, and are converted to analog signals with DACs 214 and 216. An exemplary DAC includes 10 bit resolution and a 104M/112.8M clock frequency.

Figure 3:
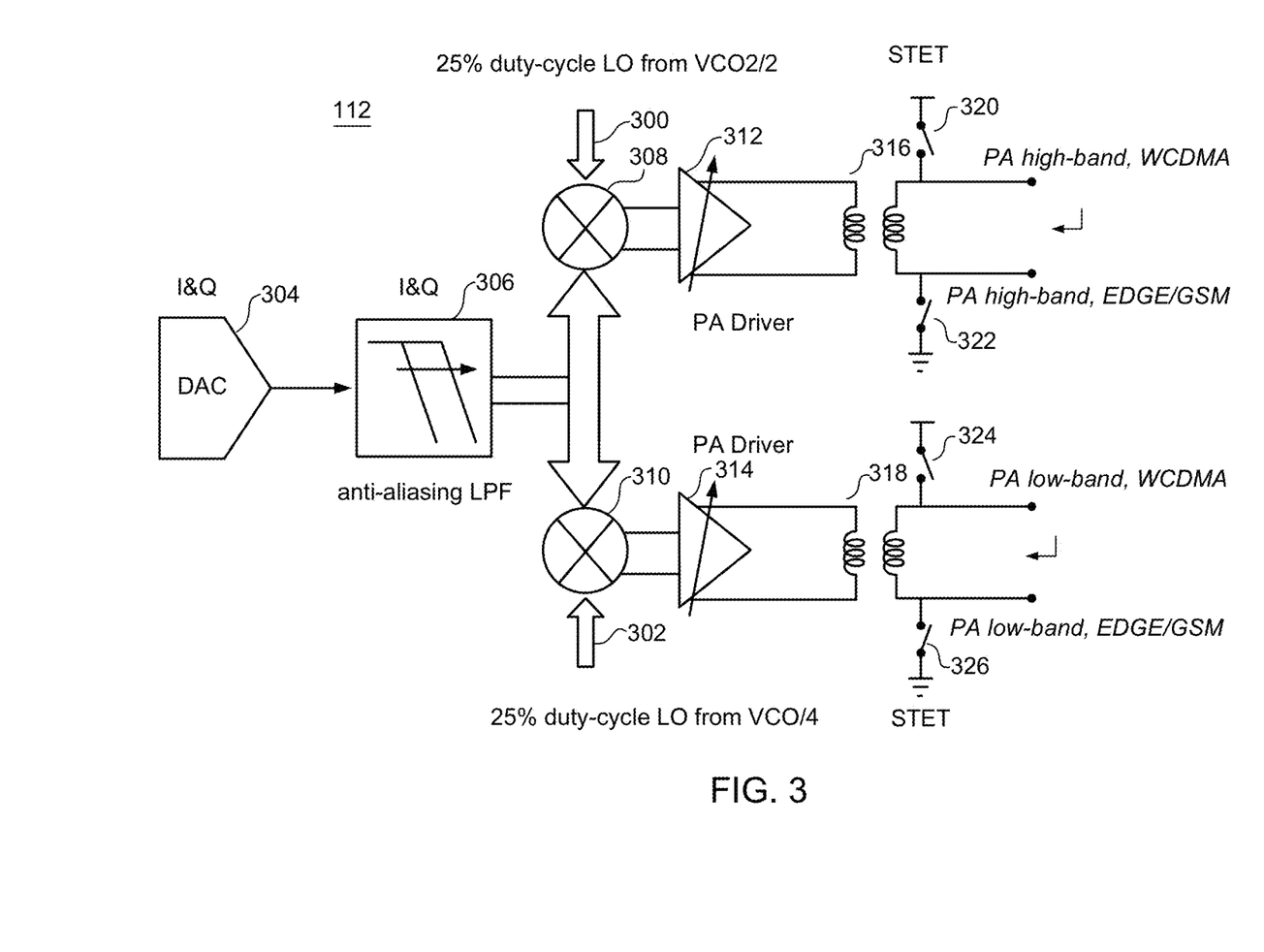
FIG. 3 is a circuit diagram of an exemplary transmitter.

FIG. 3 is a circuit diagram of another example of the exemplary transmitter 112. The transmitter 112 can provide, e.g., WCDMA and EDGE/GMS communication channels, in the high band, e.g., around 2 GHz, and the low band, e.g., around 1 GHz. WCDMA and EDGE can receive IQ channels and GSM can receive direct modulation from a PLL. Both the high and low bands can include dedicated radio frequency (RF) front-ends. Illustrated electronic components of the transmitter 112 may be replaced by similar components having similar functions according to a specific application requirement or other considerations.

The transmitter 112 can be connected to local oscillators (LO) 300, 302 that provide a frequency for signal modulation. The transmitter 112 can include a digital-to-analog converter (DAC) 304, such as one DAC for the I channel and one DAC for the Q channel. The DAC 304 converts a digital code of the communication signals to analog communication signals. The analog signals are then sent to a low pass filter (LPF) 306, for example a third order Chebyshev filter. There can be one low pass filter for the I channel and one LPF for the Q channel. The LPF outputs a filtered analog signal to the frequency mixers 308 and 310. The mixer 308 creates new frequencies from two signals: a 25% duty-cycle clocks provided by voltage-controlled oscillator and the filter analog signal from the LPF 306. The mixer 310 creates new frequencies from two signals: a 25% duty-cycle clocks provided by the voltage-controlled oscillator and the filter analog signal from the LPF 306.

The mixers 308 and 310 can output up-converted, modulated analog signals to power amplifier (PA) drivers 312 and 314, respectively. The PA drivers 312, 314 output amplified signals to transformers 316, 318, e.g., balun transformer, respectively. Switches 320 and 322 connect the outputs of the PA driver 312 and transformer 316 with ground to control whether the transmitter 112 is outputting in the high band WCDMA or the high band EDGE/GMS mode. Switches 324 and 326 connect the outputs of PA driver 312 and transformer 318 to ground to control whether the transmitter 112 is outputting in the low band WCDMA or the low band EDGE/GMS mode. In this design the PA drivers 312 and 314 are linear and can provide a power output about as high as 6 dBm. To accommodate WCDMA there can be about an 800 millivolt swing up and down at the outputs of the PA driver 312 and 314 which can require about a 2.7 V supply.

Figure 4:
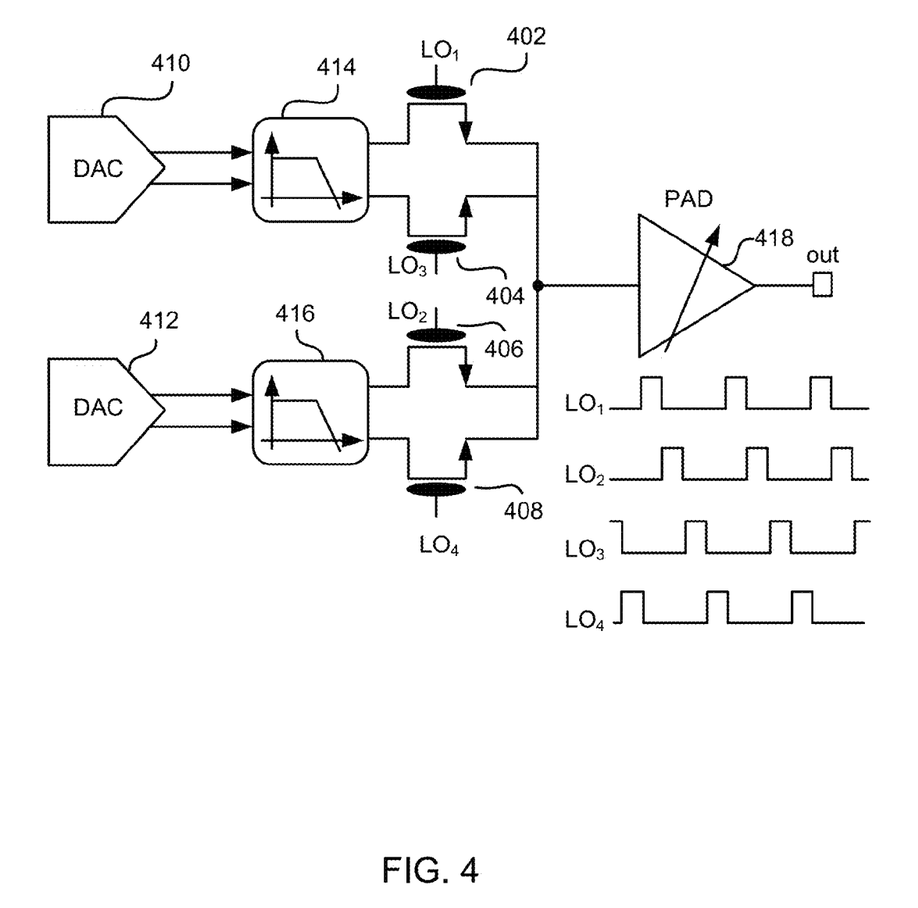
FIG. 4 is a circuit diagram of an exemplary mixer that can be used to mix signals for the transmitters described herein.

FIG. 4 is a circuit diagram of an exemplary mixer 400 that can be used to mix signals for the transmitter 112, e.g., any of the mixers described herein. The mixer 400 can be a passive mixer including switches 402, 404, 406 and 408 driven by LOs 1-4. The LOs can be 25% clock signals delayed by quarter clock periods. Other LO sizes and frequencies can also be used with the transmitter 112. DACs 410 and 412 and LPFs 414 and 416 provide an analog filtered signal to the switches 402, 404, 406 and 408. A PA driver 418 connects with the outputs of the switches 402, 404, 406 and 408 to amplify a communication signal, e.g., the mixed analog signal. The mixer 400 can provide for a single-point of calibration for LOFT and IRR, over the various bands/channels and gain settings. Only two RF inputs are needed to allow for simple Gm units for the PA driver 418.

Figure 5:
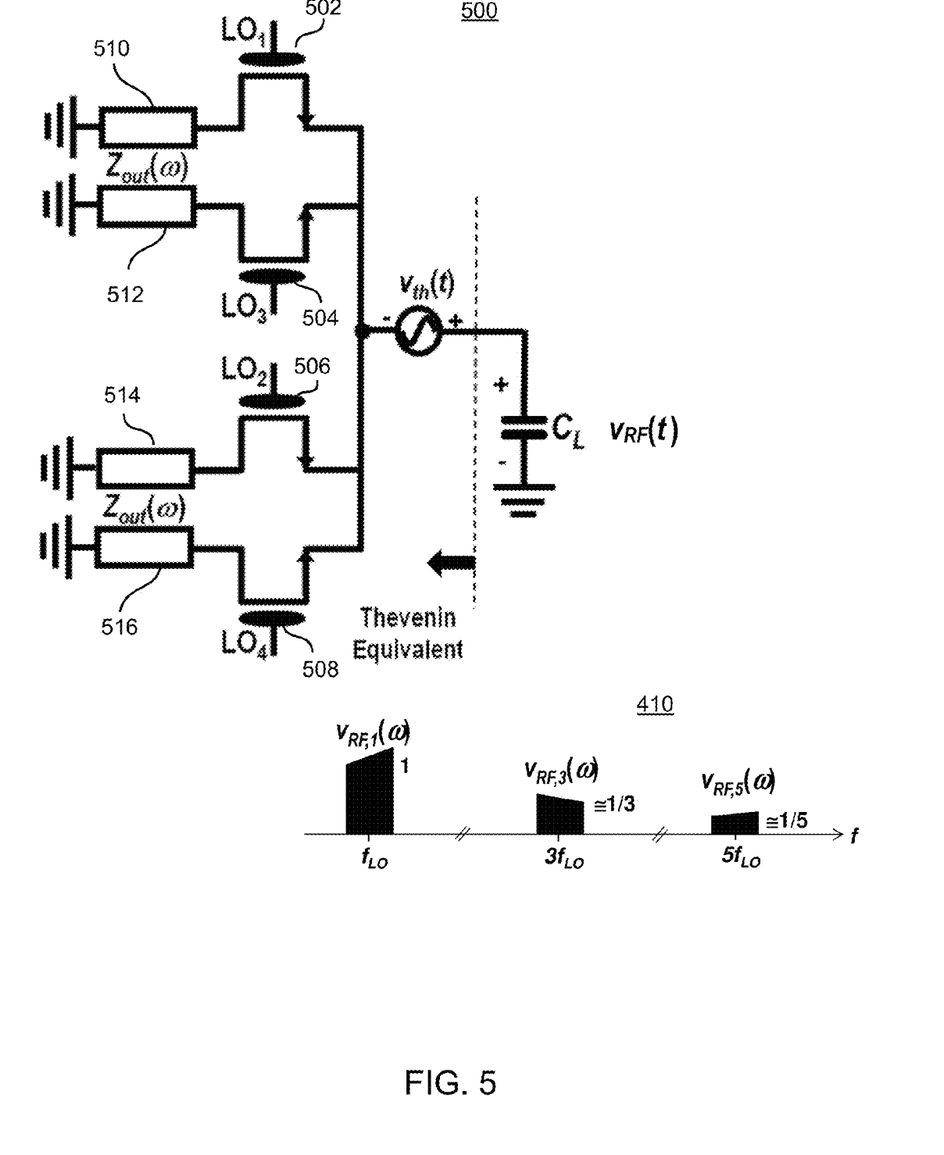
FIG. 5 is a circuit diagram of an exemplary mixer circuit.

FIG. 5 is a circuit diagram of an exemplary mixer circuit 500, in which the PA driver input impedance is modeled by capacitive load $C_L$. The circuit can include switches 502, 504, 506 and 508 driven by local oscillators LO1, LO2, LO3 and LO4 with 25% duty cycle and phase delay similar to mixer 400 LOs, for the I+, I−, Q+ and Q= channels. The frequency of the transmitter local oscillators LO1, LO2, LO3 and LO4. TX_LO can correspond to transmitter local oscillators LO1, LO2, LO3 and LO4 in FIG. 4. The switches 502, 504, 506 and 508 can connect with impedances elements $Z_{out}(\omega)$ 510, 512, 514 and 516, respectively. $Z_{out}(\omega)$ models the output impedance seen from the lowpass filter (e.g., single-ended). The baseband inputs of the lowpass filter can be equivalently modeled with its Thevenin equivalent, in which the voltage $V_{th}(t)$ is the Thevenin voltage.

At the first and third harmonics of the LO frequency, the RF voltage $V_{RF}(\omega)$ that appears across CL (PA driver input) in circuit 500 can be described by the following equations, respectively:

$$V_{RF,1}(\omega) = \frac{\sqrt{2}}{\pi} \frac{Z_L(\omega)}{Z_L(\omega) + R_{SW}}$$

$$\frac{e^{j\pi/4}V_{BB,I}(\omega - \omega_{LO}) + e^{-j\pi/4}V_{BB,Q}(\omega - \omega_{LO})}{1 + \frac{2}{\pi^2}Z_{out}(\omega - \omega_{LO})\sum_{p=-\infty}^{+\infty} \frac{1}{(4p+1)^2[Z_L(4p\omega_{LO}+\omega) + R_{SW}]}}$$

$$V_{RF,3}(\omega) = \frac{\sqrt{2}}{3\pi} \frac{Z_L(\omega)}{Z_L(\omega) + R_{SW}}$$

$$\frac{e^{-j\pi/4}V_{BB,I}(\omega - 3\omega_{LO}) + e^{-j\pi/4}V_{BB,Q}(\omega - 3\omega_{LO})}{1 + \frac{2}{\pi^2}Z'_{out}(\omega - 3\omega_{LO})\sum_{p=-\infty}^{+\infty} \frac{1}{(4p+1)^2[Z_L(4p\omega_{LO}-\omega) + R_{SW}]}}$$

$V_{RF,3}(\omega)$ at 3LO is about one-third of $V_{RF,1}(\omega)$ at LO, and the $V_{RF,5}(\omega)$ at 5LO is about one-fifth of $V_{RF,1}(\omega)$ at LO. In this example, there can be about a 6 dB adjusted channel leakage ratio (ACLR) degradation caused by the PA driver nonlinearity due to the presence of the up-converted frequency components at 3LO. This can require the PA driver, e.g., PA driver 418 of FIG. 4, to consume more power.

Figure 6:
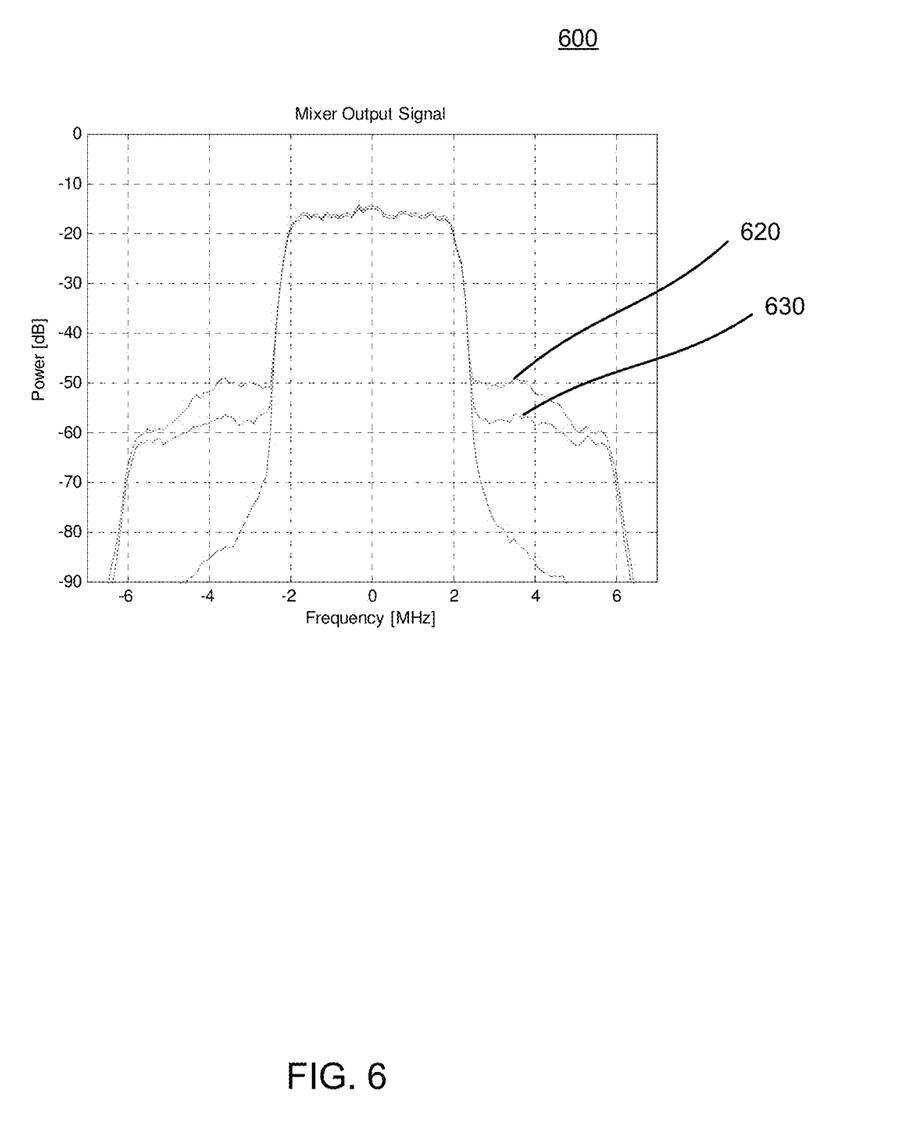
FIG. 6 is a chart illustrating an exemplary PA driver output signal power at determined frequencies for the mixer of FIG. 4.

FIG. 6 is a chart 600 illustrating an exemplary PA driver output signal power at determined frequencies for the mixer 400 of FIG. 4. With third harmonic frequencies present, ACLR for the signal 620 is about −38 dBc. With third harmonic frequencies removed, ACLR for the resulting TX signal 630 is about −44 dBc. Therefore, by removing the higher order harmonic contents, there is about a 6 dB improvement in ACLR. By removing the higher-order harmonics, linearity requirements of the PA driver 418 can be relaxed, and the PA driver 418 can be can be designed with lower power consumption.

Figure 7:
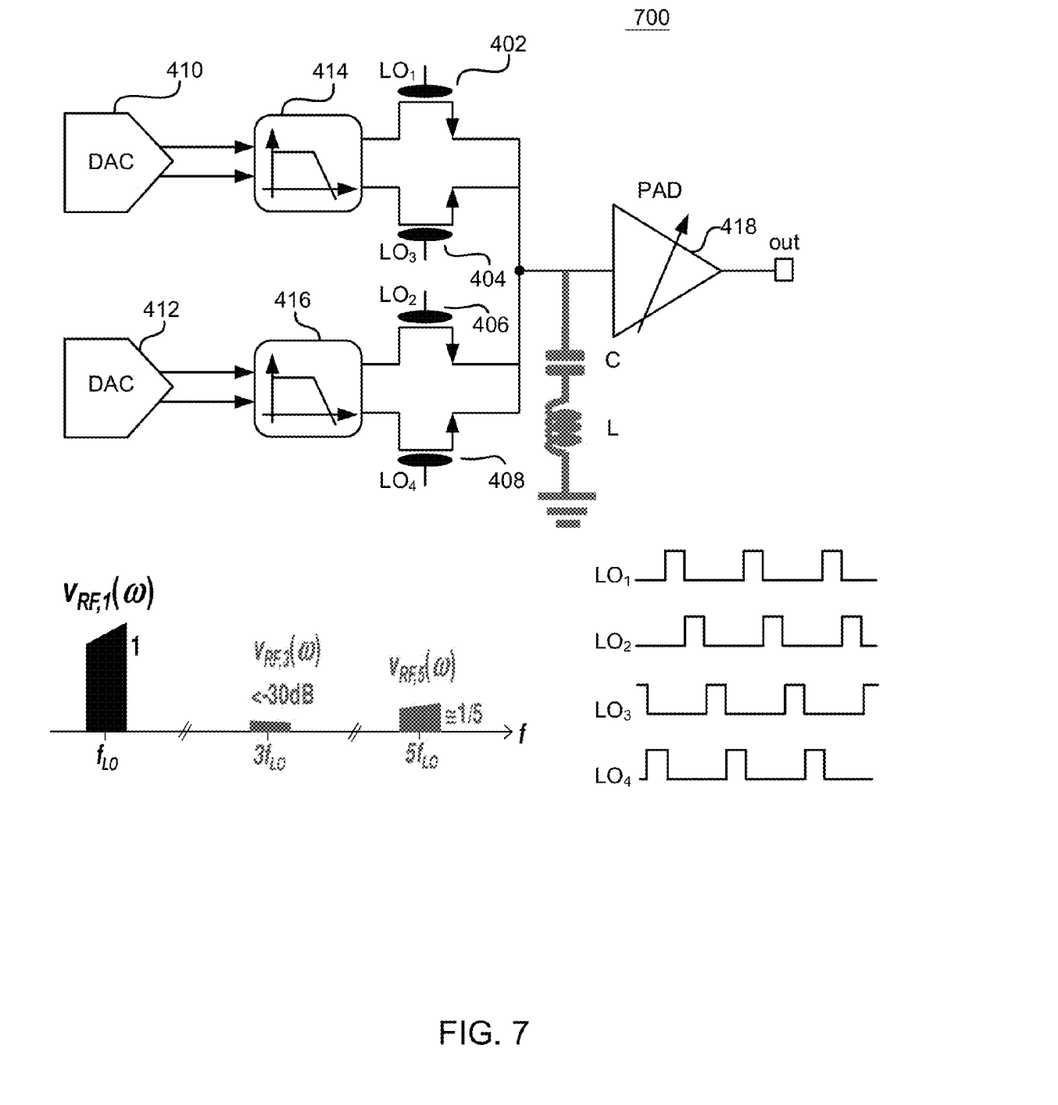
FIG. 7 is a circuit diagram of an exemplary mixer that can be used to mix signals for the transmitters described herein.

FIG. 7 is a circuit diagram of an exemplary mixer 700 that can be used to mix signals for the transmitter 112, e.g., any of the mixers described herein. Similar to FIG. 4, the mixer 700 can include switches 402, 404, 406 and 408 driven by LOs 1-4. DACs 410 and 412 and LPFs 414 and 416 provide an analog filtered signal to the switches 402, 404, 406 and 408. A PA driver 418 connects with the outputs of the switches 402, 404, 406 and 408 to amplify the mixed analog signal. To reduce or remove third harmonic frequencies, at the output of the mixer 700 which is the input of the PA driver 418, a capacitor C can be included connected in series with an inductor L and the series LC resonate at 3LO frequency. With the introduction of capacitor C and inductor L, or other resonant circuit, to the mixer 700, the frequency components around a determined order, e.g., 3LO, the third order local oscillator signal can be attenuated. The resonant frequency can also be set to attenuate harmonic frequencies around other determined orders. By attenuating the harmonic frequencies, the linearity requirement of the PA driver 418 can be relaxed. The relaxed linearity requirement can result in a PA driver 418 that consumes less power. In one example, the capacitor C is about 2-3 picofarads (pF) and the inductor is about 1 nanohenry (nH), and the resonant frequency is $1/\sqrt{LC}$ equals $3\omega_{LO}$. There is about zero impedance at $3\omega_{LO}$, therefore, about no voltage swing.

Figure 8:
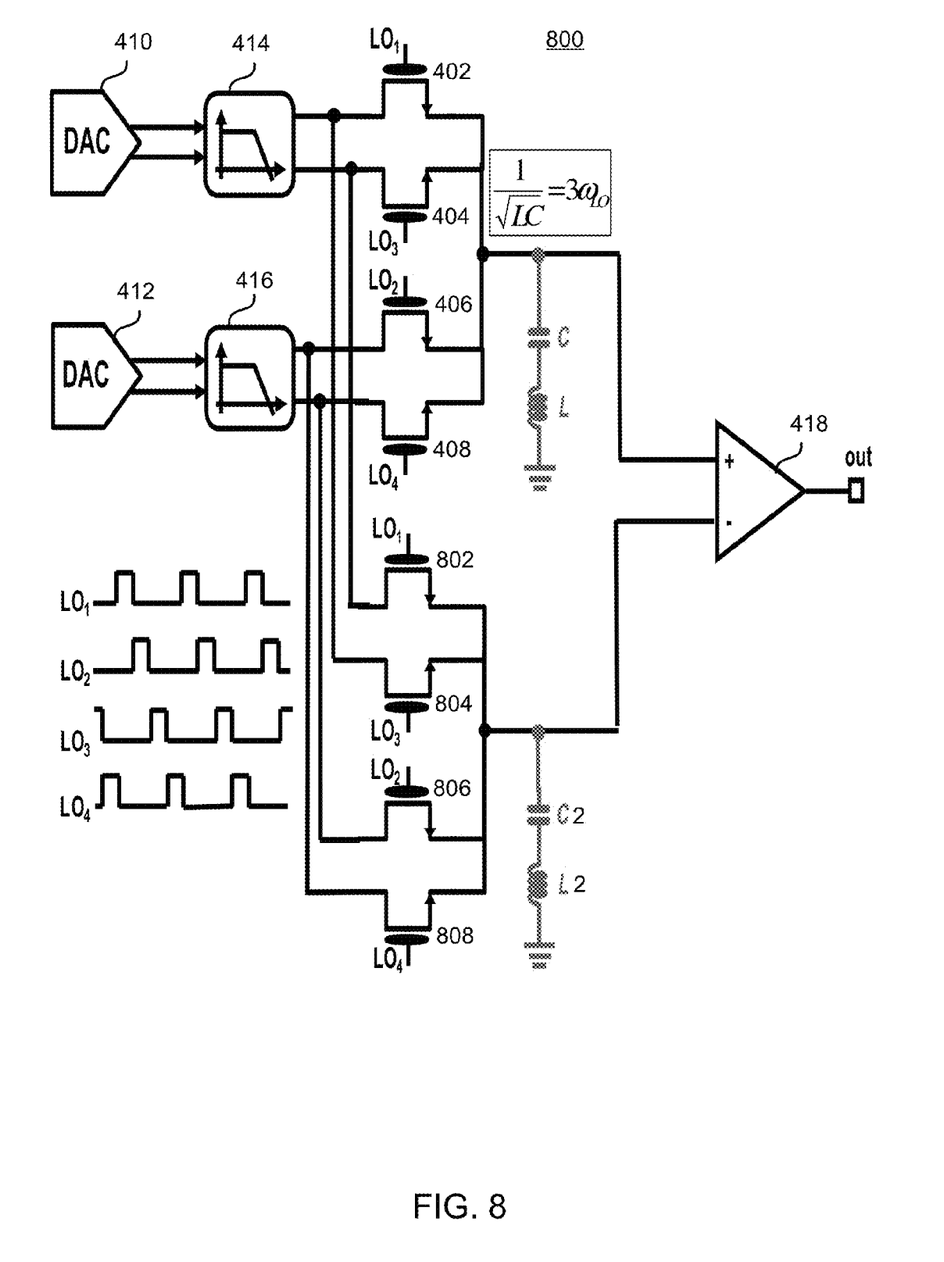
FIG. 8 is a circuit diagram of an exemplary mixer that can be used to mix signals for the transmitters described herein.

FIG. 8 is a circuit diagram of an exemplary mixer 800 that can be used to mix signals for the transmitter 112, e.g., any of the mixers described herein. Similar to FIG. 4, the mixer 800 can include switches 402, 404, 406 and 408 driven by LOs 1-4. DACs 410 and 412 and LPFs 414 and 416 provide an analog filtered signal to the switches 402, 404, 406 and 408. In this differential implementation, the mixer 800 can also include switches 802, 804, 806 and 808 driven by LOs 1-4. The PA driver 418 connects with the outputs of the switches 402, 404, 406, 408, 802, 804, 806 and 808 to amplify the mixed analog signal. To reduce or remove third harmonic frequencies, the mixer 800 can include capacitor C connected in series with inductor L and in parallel with a positive input of the PA driver 418. The mixer 800 can also include capacitor C2 connected in series with inductor L2 (where, e.g., $C_2=C$, $L_2=L$) and in parallel with a negative input of the PA driver 418. The frequency components around 3LO can be attenuated by adding capacitors C and C2, and inductors L and L2 to the mixer 800, and: $1/\sqrt{LC}$ equals $3\omega_{LO}$. Therefore, the linearity requirement of the PA driver 418 can be relaxed. The relaxed linearity requirement can result in a PA driver 418 that consumes less power.

Figure 9:
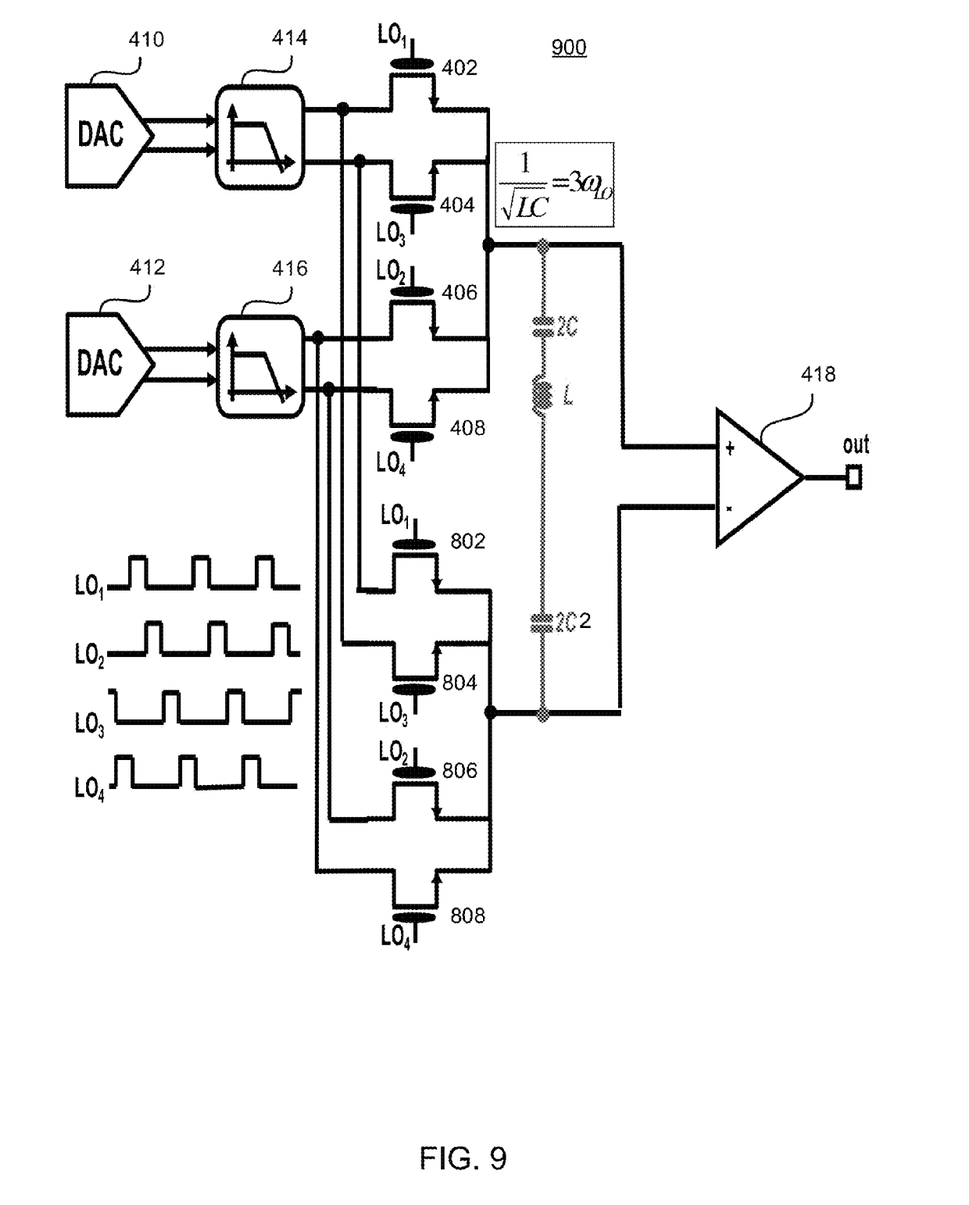
FIG. 9 is a circuit diagram of an exemplary mixer that can be used to mix signals for the transmitters described herein.

FIG. 9 is a circuit diagram of an exemplary mixer 900 that can be used to mix signals for the transmitter 112, e.g., any of the mixers described herein. Similar to FIG. 4, the mixer 900 can include switches 402, 404, 406 and 408 driven by LOs 1-4. DACs 410 and 412 and LPFs 414 and 416 provide an analog filtered signal to the switches 402, 404, 406 and 408. In a differential implementation, the mixer 900 can also include switches 802, 804, 806 and 808. A PA driver 418 connects with the outputs of the switches 402, 404, 406, 408, 802, 804, 806 and 808 to amplify the mixed analog signal. In this example, only one inductor L is needed to reduce or remove third harmonic frequencies. The mixer 900 can include a capacitor 2C, an inductor L and a capacitor 2C2 (where, e.g. C2=C) connected in series with each other between the positive input of the PA driver 418 and the negative input of the PA driver 418. In one example, the capacitors 2C and 2C2 are about 4-6 picofarads (pF). The frequency components around 3LO can be attenuated with the introduction of capacitors 2C and 2C2 and inductor L, and: $1/\sqrt{LC}$ equals $3\omega_{LO}$. Therefore, the linearity requirement of the PA driver 418 can be relaxed. The relaxed linearity requirement can result in a PA driver 418 that consumes less power.

Figure 10:
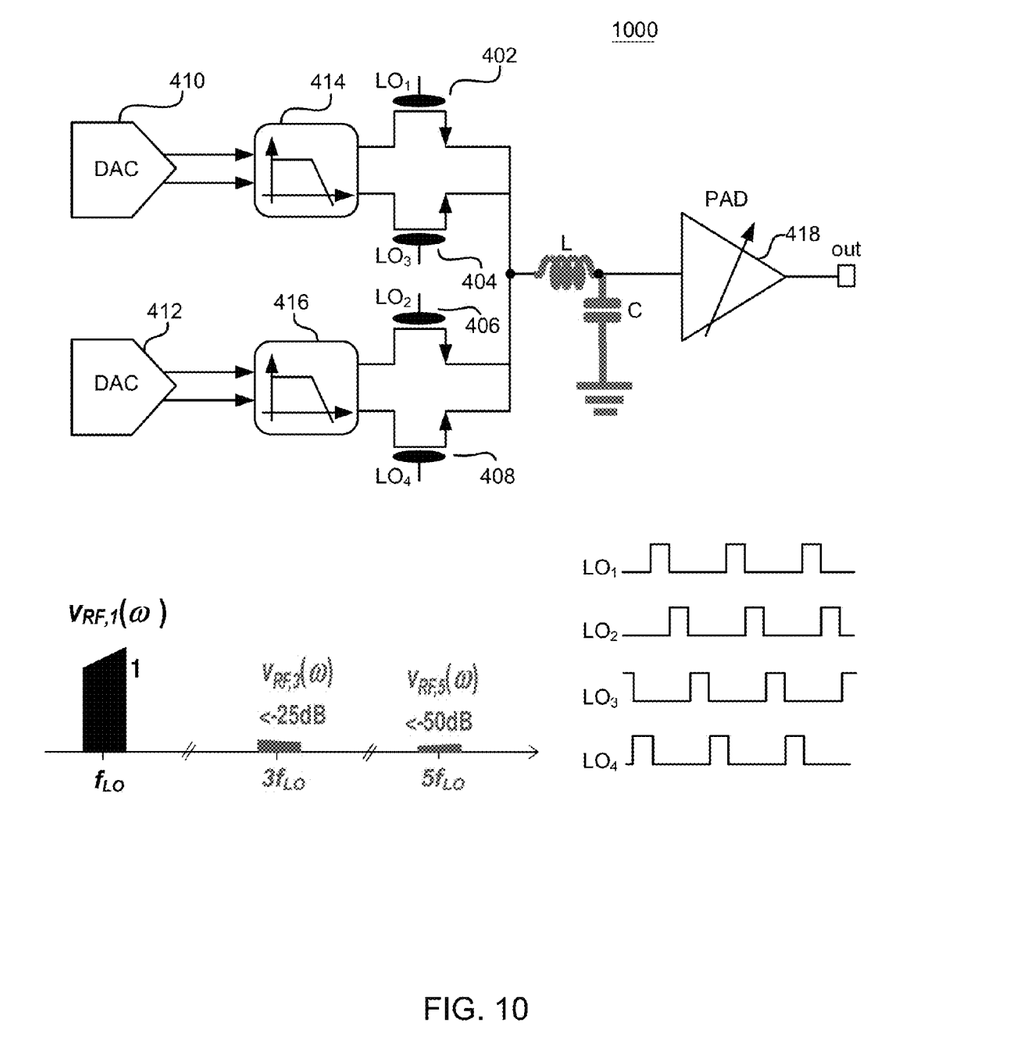
FIG. 10 is a circuit diagram of an exemplary mixer that can be used to mix signals for the transmitters described herein.

FIG. 10 is a circuit diagram of an exemplary mixer 1000 that can be used to mix signals for the transmitter 112, e.g., any of the mixers described herein. Similar to FIG. 4, the mixer 1000 can include switches 402, 404, 406 and 408 driven by LOs 1-4. DACs 410 and 412 and LPFs 414 and 416 provide an analog filtered signal to the switches 402, 404, 406 and 408. A PA driver 418 connects with the outputs of the switches 402, 404, 406 and 408 to amplify the mixed analog signal. To reduce or remove third harmonic frequencies, the mixer 1000 can include a capacitor C connected with an inductor L in parallel with the PA driver 418, and: $1/\sqrt{LC}$ equals $\omega_{LO}$. The input capacitance of the PA driver 418 can be absorbed in the capacitor C. With the introduction of capacitor C and inductor L to the mixer 1000, the frequency components around 3LO can be attenuated, e.g., by as much as −25 dB. A frequency of the 5L0 can also be attenuated, e.g., by about −50 dB. Therefore, the linearity requirement of the PA driver 418 can be relaxed. The relaxed linearity requirement can result in a PA driver 418 that consumes less power.

Figure 11:
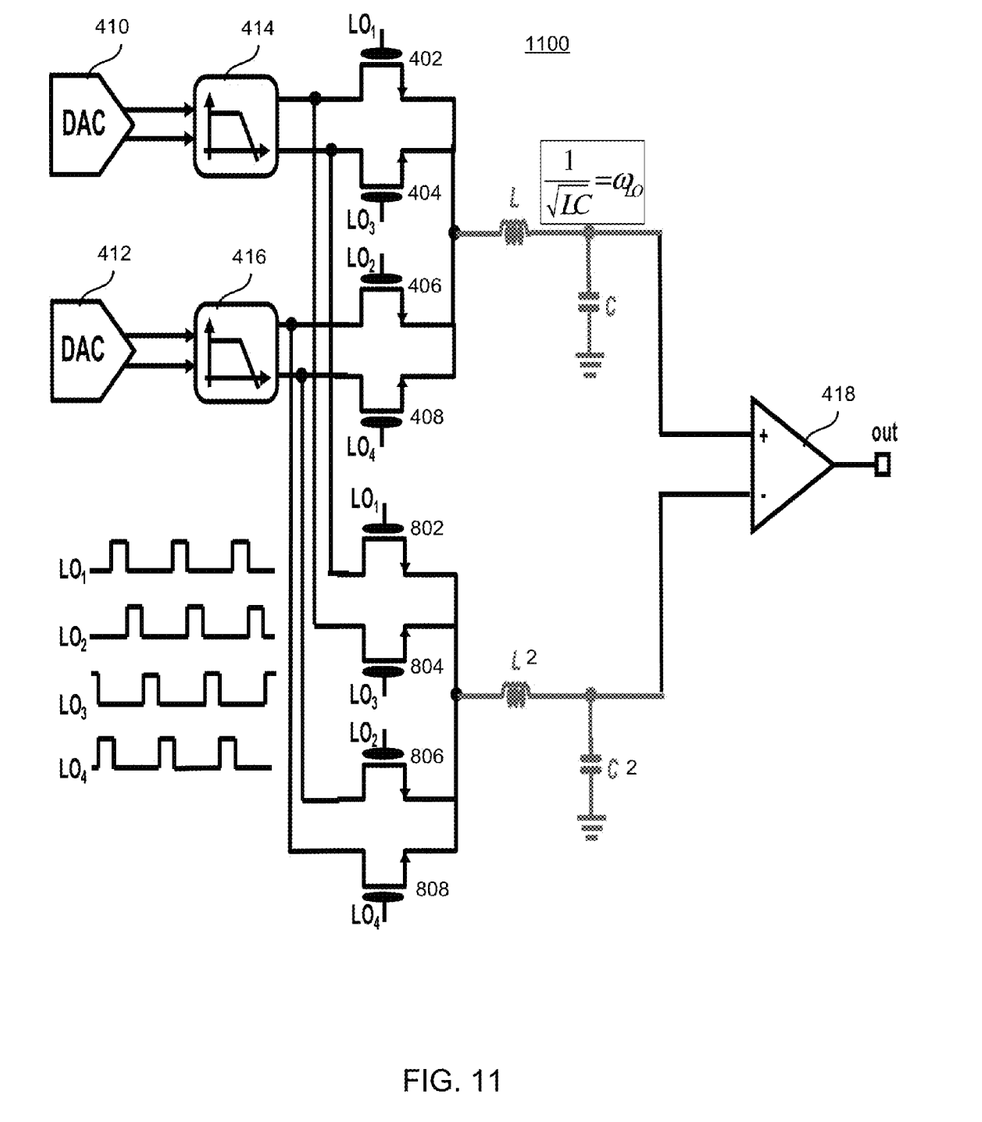
FIG. 11 is a circuit diagram of an exemplary mixer that can be used to mix signals for the transmitters described herein.

FIG. 11 is a circuit diagram of an exemplary mixer 1100 that can be used to mix signals for the transmitter 112, e.g., any of the mixers described herein. Similar to FIG. 4, the mixer 1100 can include switches 402, 404, 406 and 408 driven by LOs 1-4. DACs 410 and 412 and LPFs 414 and 416 provide an analog filtered signal to the switches 402, 404, 406 and 408. In this differential implementation, the mixer 1100 can also include switches 802, 804, 806 and 808 driven by LOs 1-4. The PA driver 418 connects with the outputs of the switches 402, 404, 406, 408, 802, 804, 806 and 808 to amplify the mixed analog signal. To reduce or remove third harmonic frequencies, the mixer 1100 can include capacitor C connected with inductor L in parallel with a positive input of the PA driver 418. The mixer 1100 can also include capacitor C2 connected with inductor L2 in parallel with a negative input of the PA driver 418 (where, e.g., L2=L and C2=C). The frequency components around 3LO can be attenuated by adding capacitors C and C2, and inductors L and L2 to the mixer 1100, and: $1/\sqrt{LC}$ equals to $\omega_{LO}$. Therefore, the linearity requirement of the PA driver 418 can be relaxed. The relaxed linearity requirement can result in a PA driver 418 that consumes less power.

Figure 12:
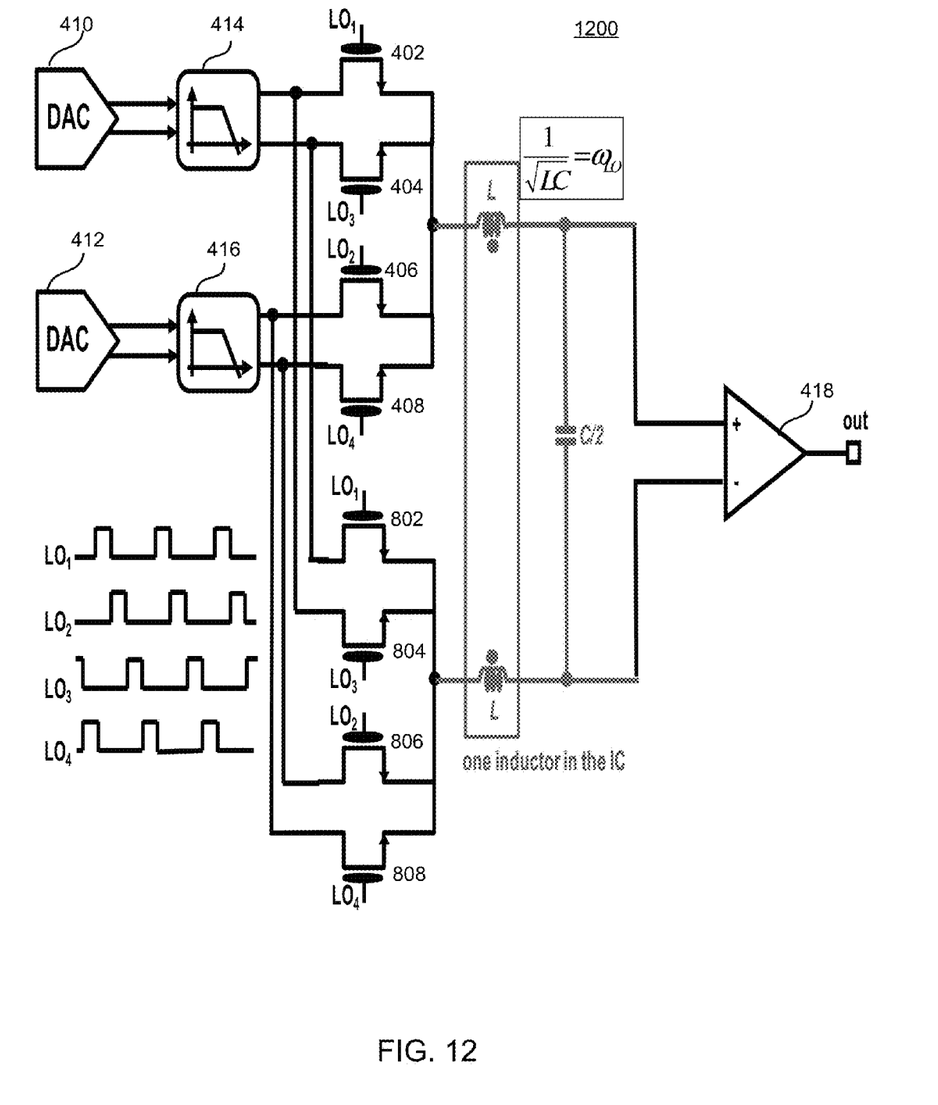
FIG. 12 is a circuit diagram of an exemplary mixer that can be used to mix signals for the transmitters described herein.

FIG. 12 is a circuit diagram of an exemplary mixer 1200 that can be used to mix signals for the transmitter 112, e.g., any of the mixers described herein. Similar to FIG. 4, the mixer 1200 can include switches 402, 404, 406 and 408 driven by LOs 1-4. DACs 410 and 412 and LPFs 414 and 416 provide an analog filtered signal to the switches 402, 404, 406 and 408. In this differential implementation, the mixer 1100 can also include switches 802, 804, 806 and 808 driven by LOs 1-4. The PA driver 418 connects with the outputs of the switches 402, 404, 406, 408, 802, 804, 806 and 808 to amplify the mixed analog signal. To reduce or remove third harmonic frequencies, the mixer 1200 can include capacitor C/2 connected in parallel with inductor L to the positive input and the negative input of the PA driver 418. In one example, the capacitor C/2 is about 1-1.5 picofarads (pF). The frequency components around 3LO can be attenuated with by adding capacitor C/2 and inductor L to the mixer 1200, and: $1/\sqrt{LC}$ equals $\omega_{LO}$. Therefore, the linearity requirement of the PA driver 418 can be relaxed. The relaxed linearity requirement can result in a PA driver 418 that consumes less power.

The transmitter 112 may be used with various types of communication systems. The communication systems may include methods, devices, and logic implemented in different combinations of hardware, software or both hardware and software to utilize the transmitter 112. For example, communication functionality may be implemented using programmed hardware or firmware elements (e.g., application specific integrated circuits (ASICs), electrically erasable programmable read-only memories (EEPROMs), controllers, microprocessors, combinations of elements, etc.), or other related components.

The functionality may be achieved using a computing apparatus that has access to a code memory which stores computer-readable program code for operation of the computing apparatus, in which case the computer-readable program code could be stored on a medium which is fixed, tangible and directly readable, (e.g., removable diskette, compact disc read only memory (CD-ROM), random access memory (RAM), dynamic random access memory (DRAM), read only memory (ROM,) fixed disk, USB drive, or other machine-readable medium such as magnetic disk or optical disk), or the computer-readable program code could be stored remotely but transmittable via a modem or other interface device (e.g., a communications adapter) connected to a network (including, without limitation, the Internet) over a transmission medium, which may be either a non-wireless medium (e.g., optical or analog communications lines) or a wireless medium (e.g., microwave, infrared or other transmission schemes) or a combination thereof.

While various embodiments of the disclosure have been described, it will be apparent that many more embodiments and implementations are possible within the scope of the disclosure. Accordingly, the disclosure is not to be restricted except in light of the attached claims and their equivalents.

What is claimed is:

1. A transmitter, comprising:
a power amplifier driver configured to amplify a communication signal;
a mixer coupled to the power amplifier driver and configured to mix the communication signal with a local oscillator signal and provide an output to the power amplifier driver;
a first capacitor coupled to the mixer and a first input the power amplifier driver;
a second capacitor coupled to the mixer and a second input of the power amplifier driver; and
an inductor coupled to the mixer and the power amplifier driver, the first and second capacitors and the inductor configured to create a resonant frequency to attenuate a frequency component at a determined harmonic of the local oscillator signal frequency.

2. The transmitter of claim 1, wherein
the inductor includes a first inductor and a second inductor;
the first input comprises a positive input and the second input comprises a negative input; and
the first capacitor is coupled in series to the first inductor and in parallel to the positive input, and the second capacitor is coupled in series to the second inductor and in parallel to the negative input.

3. The transmitter of claim 1, wherein:
the first input comprises a positive input and the second input comprises a negative input; and
the first capacitor is coupled in series to the inductor and the second capacitor, and the first capacitor is coupled to with the positive input of the power amplifier driver and the second capacitor is coupled to with the negative input.

4. The transmitter of claim 1, wherein:
the inductor includes a first inductor and a second inductor;
the first input comprises a positive input and the second input comprises a negative input; and
the first capacitor is coupled to the first inductor in parallel with the positive input, and the second capacitor is coupled to the second inductor in parallel with the negative input.

5. The transmitter of claim 1, where the capacitor and the inductor are coupled to a positive input and a negative input of the power amplifier driver.

6. The transmitter of claim 1, where the resonant frequency includes a third order harmonic of the local oscillator signal frequency.

7. The transmitter of claim 1, where the mixer is configured to provide high-band and low-band mixed signals to the power amplifier.

8. The transmitter of claim 1, where the power amplifier is configured to provide gain control and high-band and low-band multiplexing.

9. The transmitter of claim 1, wherein the first input comprises a positive input of the power amplifier driver.

10. The transmitter of claim 1, wherein the second input comprises a negative input of the power amplifier driver.

11. A transmitter, comprising:
a digital to analog converter to convert a digital code of a communication signal to an analog communication signal;
a low pass filter configured to filter the analog communication signal;
a mixer coupled to the low pass filter, the mixer configured to mix the analog communication signal with a local oscillator signal to produce a mixed signal;
a power amplifier driver coupled to the mixer, the power amplifier driver comprising a first input and a second input, the power amplifier driver configured to provide gain to the mixed signal and steer the mixed signal to a high-band transformer or a low band transformer;
a first capacitor coupled to the mixer and the first input;
a second capacitor coupled to the mixer and second input; and
an inductor coupled to the mixer and the power amplifier driver, the capacitors and the inductor configured to create a resonant frequency to attenuate frequency components at a determined harmonic of the local oscillator signal.

12. The transmitter of claim 11, where the low pass filter comprises a second order passive low pass filter.

13. The transmitter of claim 11, where the first input comprises a positive input and the second input comprises a negative input.

14. The transmitter of claim 11, where the resonant frequency includes a third order harmonic of the local oscillator signal.

15. The transmitter of claim 11, wherein the first and second inputs comprise a differential input of the power amplifier driver.

16. An integrated circuit, comprising:
a power amplifier driver to amplify a communication signal;
a mixer coupled to the power amplifier driver, the mixer configured to mix an analog communication signal with a local oscillator signal to produce a mixed signal; and
a resonant circuit coupled to the mixer and a differential input of the power amplifier driver, the resonant circuit to create a resonant frequency to attenuate frequency components at a determined harmonic of the local oscillator signal, the resonant circuit comprising:
a first capacitor coupled to a first input of the differential input; and
a second capacitor coupled to a second input of the differential input.

17. The integrated circuit of claim 16, where the resonant circuit further comprises an inductor coupled to the mixer and the power amplifier driver.

18. The integrated circuit of claim 16, where the resonant circuit is coupled in parallel to the mixer and the power amplifier driver.

19. The integrated circuit of claim 16, wherein the first input comprises a positive input and the second input comprises a negative input.

20. The integrated circuit of claim 19, wherein the second capacitor is coupled in series to the power amplifier driver.

* * * * *

UNITED STATES PATENT AND TRADEMARK OFFICE
CERTIFICATE OF CORRECTION

Page 1 of 1

PATENT NO.         : 8,913,968 B2
APPLICATION NO.    : 13/672450
DATED              : December 16, 2014
INVENTOR(S)        : Ahmad Mirzaei et al.

It is certified that error appears in the above-identified patent and that said Letters Patent is hereby corrected as shown below:

In the Claims

In column 7, claim 2, line 23, immediately after "of claim 1, wherein" insert --:--.

Signed and Sealed this
Twenty-fourth Day of March, 2015

Michelle K. Lee
*Director of the United States Patent and Trademark Office*